United States Patent
Iida

(10) Patent No.: US 9,812,292 B2
(45) Date of Patent: Nov. 7, 2017

(54) ETCHING METHOD

(71) Applicant: DISCO CORPORATION, Tokyo (JP)

(72) Inventor: Hidekazu Iida, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/933,259

(22) Filed: Nov. 5, 2015

(65) Prior Publication Data

US 2016/0260624 A1    Sep. 8, 2016

(30) Foreign Application Priority Data

Nov. 11, 2014    (JP) .................................. 2014-228755

(51) Int. Cl.
| | |
|---|---|
| *H01L 21/3065* | (2006.01) |
| *H01L 21/311* | (2006.01) |
| *H01L 21/67* | (2006.01) |
| *H01J 37/32* | (2006.01) |
| *H01L 21/683* | (2006.01) |
| *H01L 21/306* | (2006.01) |
| *H01L 21/02* | (2006.01) |

(52) U.S. Cl.
CPC .. *H01J 37/32009* (2013.01); *H01L 21/02041* (2013.01); *H01L 21/3065* (2013.01); *H01L 21/30621* (2013.01); *H01L 21/67109* (2013.01); *H01L 21/6838* (2013.01); *H01J 2237/334* (2013.01)

(58) Field of Classification Search
None
See application file for complete search history.

(56) References Cited

U.S. PATENT DOCUMENTS

| | | | | | |
|---|---|---|---|---|---|
| 5,043,299 | A | * | 8/1991 | Chang | H01L 21/28562 118/715 |
| 6,153,530 | A | * | 11/2000 | Ye | H01L 21/02071 438/720 |
| 6,339,019 | B1 | * | 1/2002 | Ogawa | H01L 21/76802 134/1.2 |
| 2004/0214446 | A1 | * | 10/2004 | Kim | C23C 16/401 438/706 |
| 2006/0183654 | A1 | * | 8/2006 | Small | C11D 7/3281 510/165 |
| 2009/0072237 | A1 | * | 3/2009 | Yamazaki | H01L 29/78696 257/72 |
| 2013/0192648 | A1 | * | 8/2013 | Cho | B08B 9/093 134/22.1 |
| 2013/0262765 | A1 | * | 10/2013 | Tsutsui | G06F 12/0802 711/118 |

FOREIGN PATENT DOCUMENTS

JP    2000-353676    12/2000

* cited by examiner

*Primary Examiner* — Shamim Ahmed
(74) *Attorney, Agent, or Firm* — Greer Burns & Crain, Ltd.

(57) ABSTRACT

Disclosed herein is an etching method for a workpiece. The etching method includes the steps of dissociating an inert gas to form a plasma in an evacuated condition of a chamber to thereby remove moisture present on the workpiece set in the chamber, and next dissociating a fluorine-based stable gas instead of the inert gas to form a plasma in the chamber after removing the moisture to thereby dry-etch the workpiece.

1 Claim, 2 Drawing Sheets

ETCHING METHOD

BACKGROUND OF THE INVENTION

Field of the Invention

The present invention relates to an etching method for etching a workpiece such as a semiconductor wafer by using a plasma formed by dissociating a fluorine-based stable gas.

Description of the Related Art

When a workpiece such as a semiconductor wafer is ground by a grinding apparatus, any grinding damage is left on the ground surface (work surface) of the workpiece, causing a reduction in die strength of the workpiece. To cope with this problem, there has been proposed a grinding system configured by incorporating an etching apparatus in the grinding apparatus (see Japanese Patent Laid-Open No. 2000-353676, for example). In this grinding system, a series of operations from grinding to etching of the workpiece is automatically performed, wherein the workpiece after grinding is loaded to the etching apparatus and the ground surface of the workpiece is subjected to plasma etching to attain a mirror finish, thereby removing any grinding damage left on the workpiece after grinding.

SUMMARY OF THE INVENTION

In etching the workpiece, a fluorine-based stable gas such as $SF_6$, $CF_4$, and $NF_3$ is used as an etching gas. However, when the fluorine-based stable gas reacts with moisture adhering to the surface of the workpiece, hydrofluoric acid (HF) is produced. Hydrofluoric acid is hazardous to the human body and also corrosive to the apparatus. Therefore, a process for removing hydrofluoric acid gas must be performed. To prevent the production of hydrofluoric acid, the workpiece is sufficiently dried after cleaning and then loaded to the etching apparatus. However, in the case that spin drying by the use of dry air is performed to dry the workpiece, the drying time is long. Further, there is a possibility that moisture in the atmosphere may adhere to the workpiece during transfer of the workpiece to the etching apparatus.

It is therefore an object of the present invention to provide an etching method which can remove the moisture present on the workpiece in a short time and can also prevent the production of hydrofluoric acid.

In accordance with an aspect of the present invention, there is provided an etching method for a workpiece, including a moisture removing step of supplying an inert gas into a chamber storing the workpiece in a condition where the chamber has been evacuated and dissociating the inert gas under first processing conditions to form a first plasma and thereby remove moisture present on the workpiece; and an etching step of supplying a fluorine-based stable gas instead of the inert gas into the chamber kept in a vacuum condition after performing the moisture removing step, and dissociating the fluorine-based stable gas under second processing conditions to form a second plasma and thereby dry-etch the workpiece.

With this configuration, even when the workpiece is loaded into the chamber in the condition where moisture is present on the workpiece, the moisture present on the workpiece is converted into a gas phase by the plasma of the inert gas, so that the workpiece can be dried in a short time. After drying the workpiece, the workpiece is subjected to dry etching by the plasma of the fluorine-based stable gas. Accordingly, hydrofluoric acid is not produced in dry etching. In this manner, there is no possibility that moisture may adhere to the workpiece before dry etching, so that the production of hydrofluoric acid can be effectively prevented to thereby eliminate the need for removing hydrofluoric acid gas. Further, since the workpiece is dried in the chamber, it is unnecessary to perform any drying process for the workpiece before loading the workpiece into the chamber.

According to the present invention, the moisture present on the workpiece can be removed by the inert gas before performing dry etching by the use of the fluorine-based stable gas, thereby reducing the drying time for the workpiece. Further, the production of hydrofluoric acid can be prevented.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
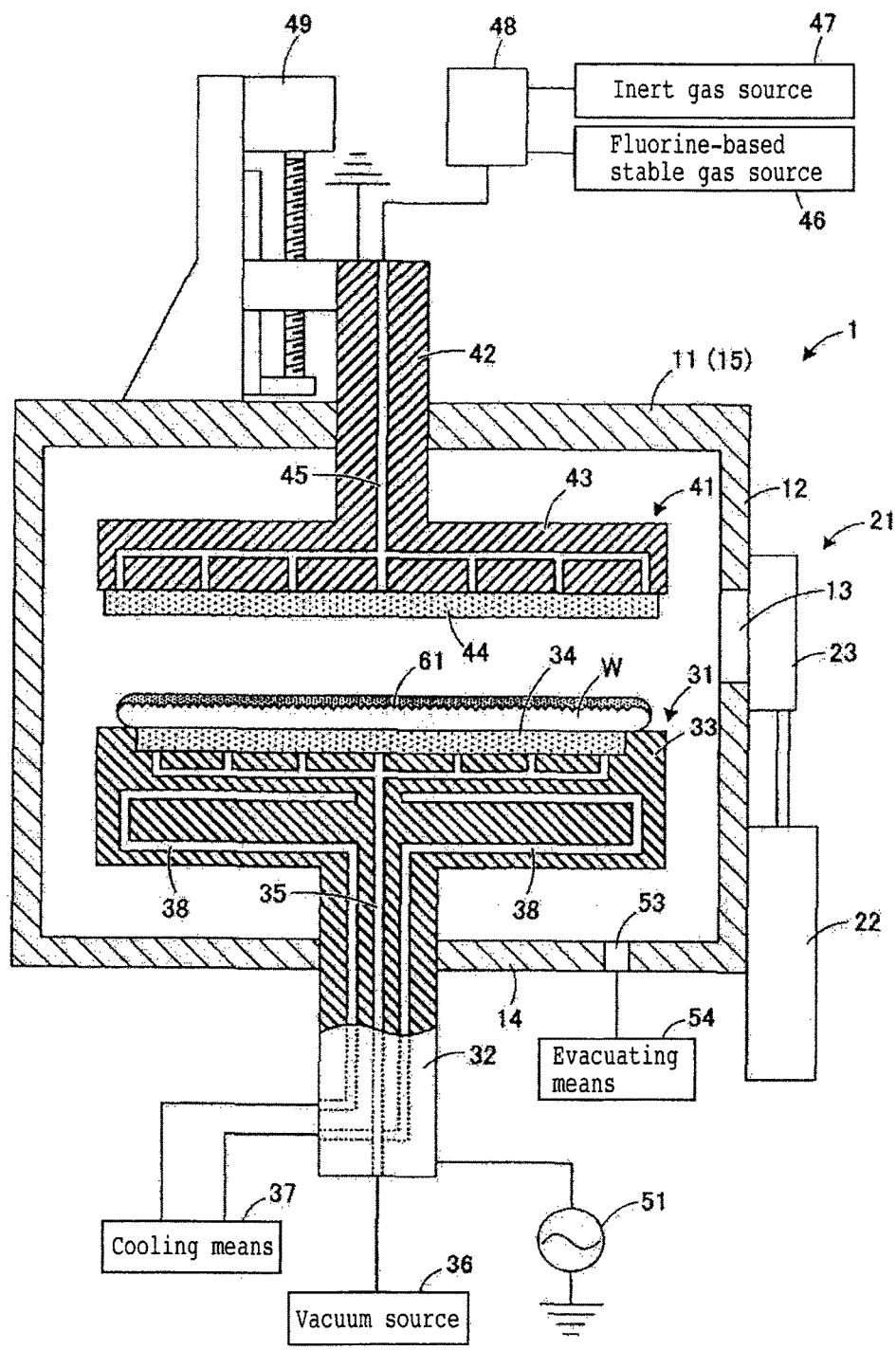
FIG. 1 is a partially sectional side view of an etching apparatus suitable for use in performing the etching method of the present invention.

A preferred embodiment of the etching method according to the present invention will now be described with reference to the attached drawings. FIG. 1 is a partially sectional side view of an etching apparatus suitable for use in performing the etching method according to the present invention. The etching apparatus in the preferred embodiment is a CCP (Capacitive Coupled Plasma) type plasma etching apparatus. However, the present invention is also applicable to an ICP (Inductive Coupled Plasma) type plasma etching apparatus and any other various plasma etching apparatuses.

As shown in FIG. 1, an etching apparatus 1 is configured in such a manner that an etching gas in a chamber 11 is dissociated to form a plasma, thereby performing dry etching to remove any grinding damage left on a workpiece W after grinding. The workpiece W is a substantially disk-shaped semiconductor wafer of silicon (Si), gallium arsenide (GaAs), etc. Reference numeral 61 denotes a bask side of the workpiece W. After grinding the back side 61, the workpiece W is loaded to the etching apparatus 1. While the workpiece W is a semiconductor wafer in the preferred embodiment, the workpiece W is not limited to a semiconductor wafer, but any workpiece to be processed by dry etching may be adopted.

In the preferred embodiment, a fluorine-based stable gas containing fluorine such as sulfur hexafluoride ($SF_6$), carbon tetrafluoride ($CF_4$), and nitrogen trifluoride ($NF_3$) is used as the etching gas. If moisture is present on the workpiece W, water and fluorine react with each other to produce hydrofluoric acid (HF), causing corrosion of the apparatus. To cope with this problem, the workpiece W is preferably loaded to the etching apparatus 1 in the condition where the workpiece W is completely dried. In general, the workpiece W after grinding is cleaned and spin-dried, and thereafter transferred to the etching apparatus 1. During transferring of the workpiece W, dry air must be blown against the workpiece W to prevent the adhesion of moisture.

In contrast, the etching apparatus 1 according to the preferred embodiment is characterized in that an inert gas is dissociated to form a plasma hard to react with water, thereby drying the workpiece W in a short time. Accordingly, the workpiece W can be loaded to the etching apparatus 1 in the condition where moisture is present on the workpiece W, and the workpiece W can be dried faster than the case of spin drying. Further, the drying of the workpiece W and the dry etching of the workpiece W are continuously performed in the chamber 11, so that there is no possibility that moisture may adhere to the workpiece W after drying and therefore the production of hydrofluoric acid in dry etching can be effectively prevented.

The chamber 11 of the etching apparatus 1 has a side wall 12, a bottom wall 14, and a top wall 15. The side wall 12 of the chamber 11 is formed with a load/unload opening 13 for loading and unloading the workpiece W. A shutter mechanism 21 for closing the load/unload opening 13 is mounted on the outer surface of the side wall 12. The shutter mechanism 21 includes a cylinder 22 and a shutter 23 connected to the upper end of the cylinder 22. The shutter 23 is vertically moved along the outer surface of the side wall 12 by the cylinder 22, thereby opening and closing the load/unload opening 13. When the load/unload opening 13 is closed by the shutter 23, an enclosed space is defined in the chamber 11. A lower electrode unit 31 and an upper electrode unit 41 for forming an electric field are provided in the chamber 11 so as to be opposed to each other in the vertical direction.

The lower electrode unit 31 is provided at the upper end of a conductive support portion 32 extending through the bottom wall 14 of the chamber 11. The lower electrode unit 31 includes a conductive holding table 33 and a disk-shaped holding plate 34 mounted on the upper surface of the holding table 33. The holding plate 34 is formed of a porous material. A suction passage 35 is formed in the holding table 33 and the support portion 32. The holding plate 34 is connected through the suction passage 35 to a vacuum source 36, so that the workpiece W is held on the holding plate 34 under suction by the vacuum produced in the holding plate 34. Further, a cooling passage 38 is formed in the lower electrode unit 31, and a refrigerant fed from cooling means 37 flows in the cooling passage 38. In etching, heat generated in the holding table 33 is transferred to the refrigerant to thereby suppress abnormal temperature rise.

The upper electrode unit 41 is provided at the lower end of a conductive support portion 42 extending through the top wall 15 of the chamber 11. The upper electrode unit 41 includes a conductive blowing table 43 for introducing the etching gas into the chamber 11 and a disk-shaped diffusing plate 44 mounted on the lower surface of the blowing table 43. The diffusing plate 44 is formed of a porous material. A gas passage 45 is formed in the blowing table 43 and the support portion 42. The diffusing plate 44 is connected through the gas passage 45 to a fluorine-based stable gas source 46 and an inert gas source 47. A selector valve 48 is interposed so as to connect the gas passage 45 selectively to the fluorine-based stable gas source 46 and the inert gas source 47, so that either the fluorine-based stable gas source 46 or the inert gas source 47 can be selected by the selector valve 48.

The fluorine-based stable gas is supplied from the fluorine-based stable gas source 46 into the chamber 11, and the inert gas is also supplied from the inert gas source 47 into the chamber 11. Examples of the inert gas include argon (Ar), helium (He), nitrogen ($N_2$), krypton (Kr), and xenon (Xe). The upper end of the support portion 42 projects upward from the top wall 15 of the chamber 11 and it is connected to a ball screw type vertically moving mechanism 49 provided on the top wall 15 of the chamber 11. By operating the vertically moving mechanism 49, the upper electrode unit 41 is moved away from or toward the lower electrode unit 31, thereby adjusting the height of the blowing table 43 to a proper position with respect to the workpiece W held on the holding table 33.

The lower electrode unit 31 is connected to a radiofrequency (RF) power source 51, and the upper electrode unit 41 is grounded. An RF voltage is applied between the lower electrode unit 31 and the upper electrode unit 41 to thereby dissociate the fluorine-based stable gas and the inert gas, so that a plasma is formed from the fluorine-based stable gas and a plasma is formed from the inert gas. The bottom wall 14 of the chamber 11 is formed with a discharge opening 53 below the holding table 33. Evacuating means 54 is connected through a hose to the discharge opening 53. The evacuating means 54 is configured by a so-called turbo molecular pump (TMP). The evacuating means 54 functions to suck the air and the plasma gases in the chamber 11 through the discharge opening 53, thereby evacuating the chamber 11 to obtain a vacuum condition in the chamber 11.

When the vacuum condition in the chamber 11 of the etching apparatus 1 is obtained, the inert gas is first blown from the upper electrode unit 41 toward the workpiece W. In this condition, an RF voltage is applied between the upper electrode unit 41 and the lower electrode unit 31 to thereby dissociate the inert gas to form a plasma. The moisture present on the workpiece W is converted into a gas phase by the plasma of the inert gas, thereby drying the workpiece W. Thereafter, the fluorine-based stable gas is blown against the workpiece W dried and dissociated to form a plasma as similarly to the case of the inert gas. Then, the workpiece W is etched by the plasma of the fluorine-based stable gas.

Figure 2A:
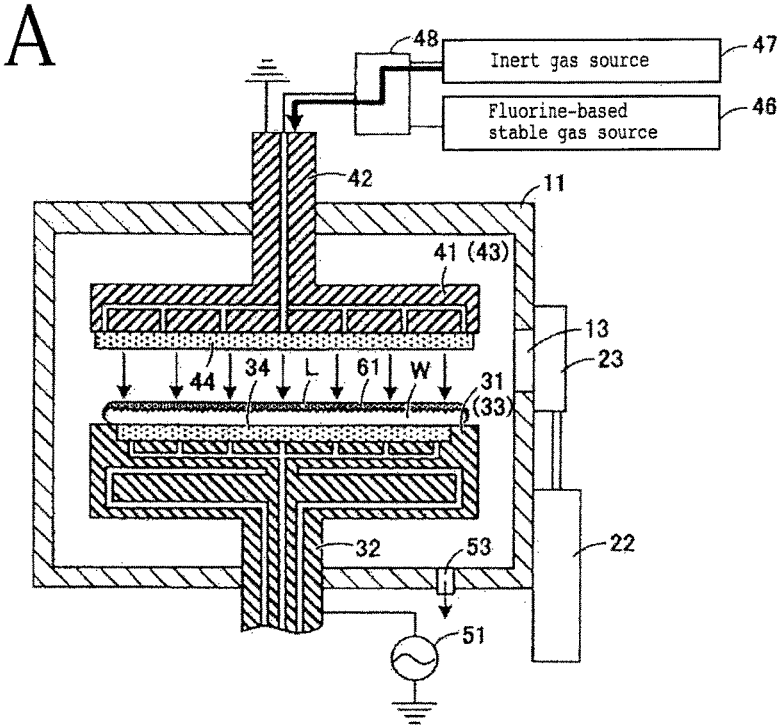
FIGS. 2A and 2B are schematic sectional side views for illustrating an etching method according to a preferred embodiment of the present invention.
Figure 2B:
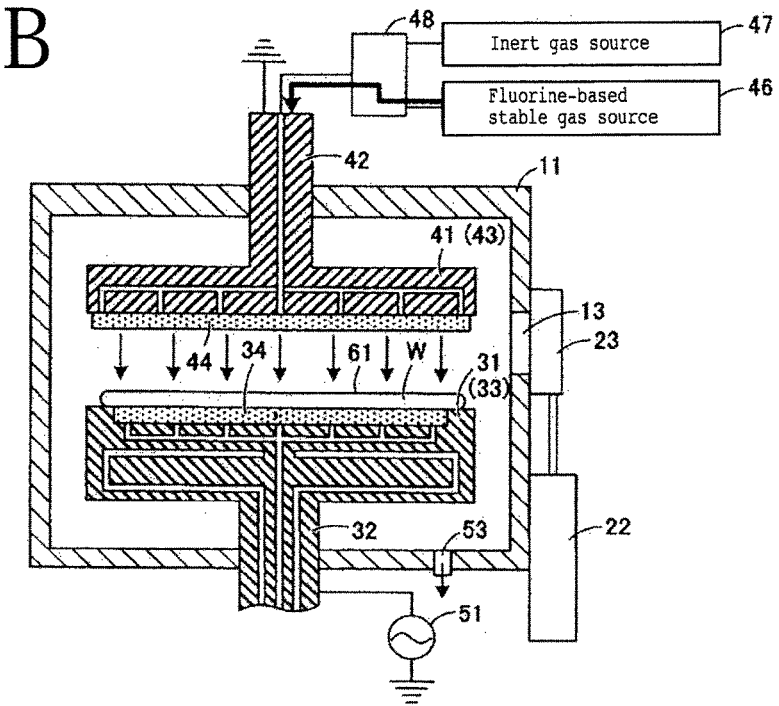

An etching method by the etching apparatus 1 will now be described with reference to FIGS. 2A and 2B. FIG. 2A shows a moisture removing step and FIG. 2B shows an etching step. The etching method shown in FIGS. 2A and 2B is merely illustrative and it may be suitably modified.

In the moisture removing step shown in FIG. 2A, the workpiece W after grinding is cleaned and next transferred to the chamber 11. Thereafter, the workpiece W is loaded from the load/unload opening 13 into the chamber 11 in the condition where moisture is present on the workpiece W. The workpiece W is held on the holding table 33 in the condition where the back side 61 of the workpiece W is oriented upward. At this time, a liquid phase L is formed on the back side 61 of the workpiece W due to the moisture present on the back side 61. In the moisture removing step, the inert gas source 47 is selected by the selector valve 48, and the supply of the gas from the fluorine-based stable gas source 46 is cut off. Thereafter, the shutter 23 is closed to define an enclosed space in the chamber 11. In this condition, the upper electrode unit 41 is moved toward the lower electrode unit 31 so as to adjust an interelectrode distance.

Thereafter, the chamber 11 is evacuated to obtain a vacuum condition in the chamber 11. In this vacuum condition, argon gas (Ar) as the inert gas is blown from the upper electrode unit 41 toward the workpiece W. At this time, the inert gas is diffused by the diffusing plate 44, so that the inert gas can be uniformly blown against the back side 61 of the workpiece W. In the condition where the inert gas is blown, an RF voltage is applied between the upper electrode unit 41 and the lower electrode unit 31 to thereby dissociate (ionize) the inert gas, thereby forming a plasma (ions). The moisture present on the workpiece W is converted into a gas phase by the plasma of the inert gas, thereby drying the workpiece W.

The plasma of the inert gas does not react with the moisture present on the workpiece W, but electrons collide with the moisture to decompose it into hydrogen and oxygen, thus forming a gas phase. Accordingly, water vapor and moisture are not left in the chamber 11. As a result, the workpiece W can be dried well fast as compared with the case of spin drying by the use of dry air.

In the moisture removing step, the workpiece W is dried under the following first processing conditions, for example. The first processing conditions shown below are merely illustrative, and they may be suitably changed according to the performance of the etching apparatus, the workpiece to be etched, the kind of the inert gas, etc.

<First Processing Conditions>
  Kind of gas: Ar
  Frequency of RF voltage: 2.0 to 13.56 MHz
  RF power: 500 to 3000 W
  Pressure in the chamber: 5 to 500 Pa
  Drying time: 5 to 30 seconds After performing the moisture removing step, the etching step shown in FIG. 2B is performed. In the etching step, the selector valve 48 is operated to select the fluorine-based stable gas source 46 instead of the inert gas source 47. Accordingly, the etching gas from the fluorine-based stable gas source 46 is supplied and the supply of the inert gas from the inert gas source 47 is cut off. In the condition where the vacuum in the chamber 11 is maintained, sulfur hexafluoride ($SF_6$) as the fluorine-based stable gas is blown from the upper electrode unit 41 toward the workpiece W. At this time, the fluorine-based stable gas is diffused by the diffusing plate 44, so that the fluorine-based stable gas can be uniformly blown against the back side 61 of the workpiece W dried.

In the condition where the fluorine-based stable gas is blown, an RF voltage is applied between the upper electrode unit 41 and the lower electrode unit 31 to thereby dissociate the fluorine-based stable gas, thereby forming a plasma (radicals). The back side 61 of the workpiece W undergoes dry etching (isotropic etching) by a radical chain reaction due to the plasma of the fluorine-based stable gas. As a result, the grinding damage is removed from the workpiece W to thereby improve a die strength. Since the workpiece W is in a completely dry condition in the etching step, the fluorine-based stable gas does not react with moisture, so that hydrofluoric acid (HF) is not produced in the etching step. Accordingly, it is unnecessary to provide any equipment for removing hydrofluoric acid gas in the chamber 11.

In the etching step, the workpiece W is etched under the following second processing conditions, for example. The second processing conditions shown below are merely illustrative and they may be suitably changed according to the performance of the etching apparatus, the workpiece to be etched, the kind of the fluorine-based stable gas, etc.

<Second Processing Conditions>
  Kind of gas: $SF_6$
  Frequency of RF voltage: 13.56 MHz
  RF power: 1000 to 5000 W
  Pressure in the chamber: 50 to 300 Pa
  Etching time: 30 to 180 seconds After completing the dry etching for the workpiece W, the application of the RF voltage between the upper electrode unit 41 and the lower electrode unit 31 is stopped and the selector valve 48 is closed to cut off the supply of the gas from the fluorine-based stable gas source 46. Thereafter, the shutter 23 is opened to expose the chamber 11 through the load/unload opening 13 to the outside. In this condition, the workpiece W is unloaded from the chamber 11 through the load/unload opening 13. In this manner, the moisture removing step and the etching step are continuously performed in the chamber 11 of the etching apparatus 1 according to the preferred embodiment. Accordingly, the workpiece W can be loaded into the chamber 11 in the condition where moisture is present on the workpiece W.

In the preferred embodiment, the inert gas and the fluorine-based stable gas may be discharged from the discharge opening 53 and discarded or returned to the inert gas source 47 and the fluorine-based stable gas source 46 for reuse. By circulating the inert gas and the fluorine-based stable gas, any undissociated part of the gases can be effectively used. Further, the interelectrode distance between the upper electrode unit 41 and the lower electrode unit 31 may be changed between the moisture removing step and the etching step.

As described above, in the etching method according to the preferred embodiment, even when the workpiece W is loaded into the chamber 11 in the condition where moisture is present on the workpiece W, the moisture present on the workpiece W is converted into a gas phase by the plasma of the inert gas, so that the workpiece W can be dried in a short time. After drying the workpiece W, the workpiece W is subjected to dry etching by the plasma of the fluorine-based stable gas. Accordingly, hydrofluoric acid is not produced in dry etching. In this manner, there is no possibility that moisture may adhere to the workpiece W before dry etching, so that the production of hydrofluoric acid can be effectively prevented to thereby eliminate the need for removing hydrofluoric acid gas. Further, since the workpiece W is dried in the chamber 11, it is unnecessary to perform any drying process for the workpiece W before loading the workpiece W into the chamber 11.

The present invention is not limited to the above preferred embodiment, but various modifications may be made. The size, shape, etc. of the parts shown in the attached drawings are merely illustrative and they may be suitably changed within the scope where the effects of the present invention can be exhibited. Further, various changes may be made without departing from the scope of the object of the present invention.

While the etching method in the preferred embodiment is applied to the workpiece W after grinding, the present invention is not limited to this configuration. For example, the etching method of the present invention may be applied to the workpiece W after dividing by the use of a cutting blade or the like. Also in such a case, a cutting water may be converted into a gas phase and thereby removed by the plasma of the inert gas, and dry etching may be next performed by the plasma of the fluorine-based stable gas to thereby remove any cutting damage.

Further, while the moisture present on the workpiece W is decomposed into hydrogen and oxygen in the moisture removing step in the preferred embodiment, the present invention is not limited to this configuration. That is, the method of making a gas phase in the moisture removing step is not limited provided that the moisture present on the workpiece W can be removed.

As described above, the present invention has the effects that the moisture present on the workpiece can be removed in a short time and the production of hydrofluoric acid can be prevented. In particular, the present invention is useful as an etching method for etching a workpiece such as a semiconductor wafer by using the plasma of the fluorine-based stable gas.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. An etching method for a workpiece, comprising:
A workpiece loading step for loading a workpiece with a moisture attached thereon into a chamber;
a workpiece holding step for holding the moisture attached workpiece by a holding table with a ground surface of the workpiece oriented upward;
an evacuating step for evacuating the chamber to obtain a vacuum condition within the chamber after holding the workpiece by the holding table;
a moisture removing step of supplying an inert gas into the chamber storing said workpiece in a condition where said chamber has been evacuated and dissociating said inert gas under first processing conditions to form a first plasma and thereby remove moisture present on said workpiece and dry the workpiece; and
an etching step of supplying a fluorine-based stable gas instead of said inert gas into said chamber kept in the vacuum condition after performing said moisture removing step, and blowing said fluorine-based stable gas toward said workpiece and dissociating said fluorine-based stable gas under second processing conditions to form a second plasma and thereby dry-etch said dried workpiece.

* * * * *